US006326222B2

(12) United States Patent
Derraa

(10) Patent No.: US 6,326,222 B2
(45) **Date of Patent: *Dec. 4, 2001**

(54) FIELD EMISSION ARRAYS AND METHOD OF FABRICATING EMITTER TIPS AND CORRESPONDING RESISTORS THEREOF WITH A SINGLE MASK

(75) Inventor: Ammar Derraa, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/819,298

(22) Filed: Mar. 27, 2001

Related U.S. Application Data

(63) Continuation of application No. 09/426,966, filed on Oct. 26, 1999, now Pat. No. 6,210,985, which is a continuation of application No. 09/260,633, filed on Mar. 1, 1999, now Pat. No. 6,017,772.

(51) Int. Cl.$^7$ .......... H01L 21/00
(52) U.S. Cl. .......... 438/20; 445/50; 445/51
(58) Field of Search .......... 438/20; 445/50, 445/51

(56) References Cited

U.S. PATENT DOCUMENTS 5,229,331 * 7/1993 Doan et al. .
5,302,238 * 4/1994 Roe et al. .
5,312,514 * 5/1994 Kumar .
5,372,973 * 12/1994 Doan et al. .
5,374,868 * 12/1994 Tjaden et al. .
5,585,301 * 12/1996 Lee et al. .
5,633,560 * 5/1997 Huang .
5,637,023 * 6/1997 Itoh et al. .
5,641,706 * 6/1997 Tjaden et al. .
5,669,801 * 9/1997 Lee .
5,696,385 * 12/1997 Song et al. .
5,712,534 * 1/1998 Lee et al. .
5,735,721 * 4/1998 Choi .

* cited by examiner

*Primary Examiner*—John F. Niebling
*Assistant Examiner*—David A. Zarneke
(74) *Attorney, Agent, or Firm*—TraskBritt

(57) ABSTRACT

A method for fabricating field emission arrays employs a single mask to define emitter tips, their corresponding resistors, and, optionally, conductive lines. One or more material layers from which the emitter tips and resistors will be defined are formed over and laterally adjacent substantially parallel conductive lines. The exposed surface of the layer or layers of emitter tip and resistor material or materials may be planarized. The emitter tips and underlying resistors are then defined. Substantially longitudinal center portions of the conductive lines may be exposed between adjacent lines of emitter tips, with at least a lateral edge portion of each conductive line being shielded by material that remains following the formation of the emitter tips and resistors. The exposed portions of the conductive lines may be removed in order to define conductive traces. Field emission arrays and display devices fabricated by such methods are also disclosed.

22 Claims, 5 Drawing Sheets

FIELD EMISSION ARRAYS AND METHOD OF FABRICATING EMITTER TIPS AND CORRESPONDING RESISTORS THEREOF WITH A SINGLE MASK

CROSS REFERENCE TO RELATED APPLICATION

This application is a continuation of application Ser. No. 09/426,966, filed Oct. 26, 1999, now U.S. Pat. No. 6,210,985, which is a continuation of application Ser. No. 09/260,633, filed Mar. 1, 1999, now U.S. Pat. No. 6,017,772, issued Jan. 25, 2000.

This invention was made with Government support under Contract No. ARPA-95-42 MDT-00068 awarded by Advanced Research Projects Agency (ARPA). The Government has certain rights in this invention.

BACKGROUND OF THE INVENTION

1. Field of the Invention

The present invention relates to methods of fabricating field emission arrays. Particularly, the present invention relates to field emission array fabrication methods wherein the emitter tips and their corresponding resistors are fabricated through a single mask. More particularly, the present invention relates to field emission array fabrication methods that employ only one mask to define the emitter tips and their corresponding resistors and that do not require a mask to define the column lines thereof.

2. State of the Art

Typically, field emission displays ("FEDs") include an array of pixels, each of which includes one or more substantially conical emitter tips. The array of pixels of a field emission display is typically referred to as a field emission array. Each of the emitter tips is electrically connected to a negative voltage source by means of a cathode conductor line, which is also typically referred to as a column line.

Another set of electrically conductive lines, which are typically referred to as row lines or as gate lines, extend over the pixels of the field emission array. Row lines typically extend across a field emission display substantially perpendicularly to the direction in which the column lines extend. Accordingly, the paths of a row line and of a column line typically cross proximate (above and below, respectively) the location of an emitter tip. The row lines of a field emission array are electrically connected to a relatively positive voltage source. Thus, as a voltage is applied across the column line and the row line, electrons are emitted by the emitter tips and accelerated through an opening in the row line.

As electrons are emitted by emitter tips and accelerate past the row line that extends over the pixel, the electrons are directed toward a corresponding pixel of a positively charged electro-luminescent panel of the field emission display, which is spaced apart from and substantially parallel to the field emission array. As electrons impact a pixel of the electro-luminescent panel, the pixel is illuminated. The degree to which the pixel is illuminated depends upon the number of electrons that impact the pixel.

Numerous techniques have been employed to fabricate field emission arrays and the resistors thereof. An exemplary field emission array fabrication technique includes fabricating the column lines and emitter tips prior to fabricating a dielectric layer and the overlying grid structure, such as by the methods of U.S. Pat. No. 5,302,238, issued to Fred L. Roe et al. on Apr. 12, 1994, and U.S. Pat. No. 5,372,973, issued to Trung T. Doan et al. on Dec. 13, 1994. Alternatively, a field emission array may be fabricated by forming the dielectric layer and the overlying grid structure, then disposing material over the grid structure and into openings therethrough to form the emitter tips, such as by the technique disclosed by U.S. Pat. No. 5,669,801, issued to Edward C. Lee on Sep. 23, 1997. Such conventional field emission array fabrication methods typically require the use of masks to independently define the various features, such as the column lines, resistors, and emitter tips, thereof.

Another exemplary method of fabricating field emission arrays is taught in U.S. Pat. No. 5,374,868 (hereinafter "the '868 Patent"), issued to Kevin Tjaden et al. on Dec, 20, 1994. The fabrication method of the '868 Patent includes defining trenches in a substrate. The trenches correspond substantially to columns of pixels of the field emission array. A layer of insulative material is disposed over the substrate, including in the trenches thereof. A layer of conductive material and a layer of cathode material (e.g., polysilicon) are sequentially disposed over the layer of insulative material. A mask may then be disposed over the layer of cathode material and the emitter tips and their corresponding column lines defined through the cathode material and "highly conductive" material layers, respectively. The method of the '868 Patent is, however, somewhat undesirable in that the mask thereof is not also employed to fabricate resistors, which limit high current and prevent device failure. Moreover, in the embodiment of the method of the '868 Patent that employs a single mask to fabricate both the emitter tips and their corresponding column lines, neither the "highly conductive" material nor the cathode material is planarized. Thus, the layer of cathode material may have an uneven surface and the heights of the emitter tips defined therein may vary substantially. In embodiments of the method of the '868 Patent where the layer of "highly conductive" material is planarized, only the emitter tips are defined through the mask.

Accordingly, there is a need for a field emission array fabrication process that employs a minimal number of masks to define emitter tips of substantially uniform height, their corresponding resistors, and their corresponding column lines.

SUMMARY OF THE INVENTION

The present invention includes a method of fabricating a field emission array, including the emitter tips, associated resistors, and column lines thereof, and field emission arrays fabricated by the method.

The method of the present invention includes disposing a layer of conductive material over a surface of a substrate. The layer of conductive material may be deposited onto the substrate in a desired thickness by known techniques. Known patterning techniques may be employed to define substantially mutually parallel conductive lines, each of which extends over the substrate, from the layer of conductive material. As the layer of conductive material is patterned, the substrate is exposed between adjacent conductive lines.

A layer of conductive material or semiconductive material, from which emitter tips and resistors may be defined, may be disposed over the exposed regions of the substrate and over the conductive lines. Thus, the layer of conductive material or semiconductive material, which is also referred to herein as an emitter tip-resistor layer, may comprise a low work function material. The layer of conductive material or semiconductive material may be planarized by known processes, such as by known chemical-mechanical planarization ("CMP") techniques.

The relative thicknesses of the conductive lines and the layer of conductive material or semiconductive material preferably facilitate the exposure of at least a substantially longitudinal center portion of the conductive lines as emitter tips and their corresponding resistors are defined from the layer of conductive material or semiconductive material. Moreover, the thickness of the layer of conductive material or semiconductive material preferably facilitates the definition of emitter tips and resistors of a desired height.

The layer of conductive or semiconductive material may be patterned by known processes, such as by disposing a mask thereover and removing selected potions of the layer through apertures of the mask. As the layer of conductive material or semiconductive material is patterned, emitter tips and their corresponding resistors may be formed by employing a single mask. Thus, the emitter tips and their corresponding resistors may be defined substantially simultaneously.

Of course, the emitter tips and resistors may comprise different materials, in which case the layer of conductive material or semiconductive material would include a lower layer of resist material and an upper layer of emitter tip material. When different materials are employed to fabricate the resistors and emitter tips of the field emission array, different etchants may be required to pattern the layer of conductive material or semiconductive material.

As the emitter tips and their corresponding resistors are defined through the layer of conductive material or semiconductive material, portions of the layer of conductive material or semiconductive material over the conductive lines may also be removed. Preferably, the layer of conductive material or semiconductive material extends over at least one peripheral edge of the conductive lines. Thus, only a portion of each of the conductive lines is exposed through the layer of conductive material or semiconductive material.

The column lines of the field emission array are defined by removing at least the substantially center longitudinal portion thereof. Preferably, a substantially anisotropic etchant is employed that etches the conductive material of the conductive lines with selectivity over the material or materials from which the emitter tips and resistors are defined. Thus, when a portion of the layer of conductive material or semiconductive material extends over a peripheral edge of the conductive lines, an underlying lateral edge portion of each of the conductive lines is effectively shielded from the etchant. Preferably, both lateral edges of the conductive lines are preserved and the conductive material substantially removed therebetween to expose the substrate centrally therethrough. Thus, the lateral edges of one conductive line may each define a portion of separate, adjacent column lines.

The field emission array may then be processed, as known in the art, to fabricate an anodic grid structure, including row lines that are substantially electrically insulated from the column lines. The field emission array may then be assembled with other components of a field emission display, such as a display screen and housing.

Other features and advantages of the present invention will become apparent to those of ordinary skill in the art through a consideration of the ensuing description, the accompanying drawings, and the appended claims.

DETAILED DESCRIPTION OF THE INVENTION

Figure 1:
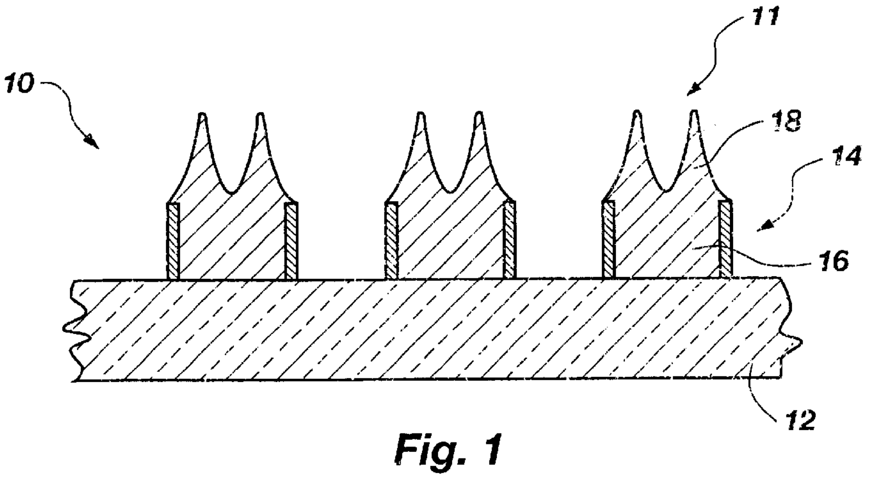
FIG. 1 is a cross-sectional schematic representation of a field emission array that may be fabricated in accordance with the method of the present invention.

With reference to FIG. 1, a field emission array 10 is illustrated. Field emission array 10 includes a substrate 12 upon which various features of field emission array 10, including the column lines 14, resistors 16, and emitter tips 18 thereof, may be fabricated. A pixel 11 of field emission array 10 may include one or more emitter tips 18 and their associated, underlying resistor 16 or resistors. Each resistor 16 and its associated emitter tip or emitter tips 18 may be connected to or otherwise in communication with a relatively negative voltage source by means of one or more column lines 14, or lateral conductive layers, which are preferably disposed laterally adjacent a corresponding resistor 16.

Figure 2:
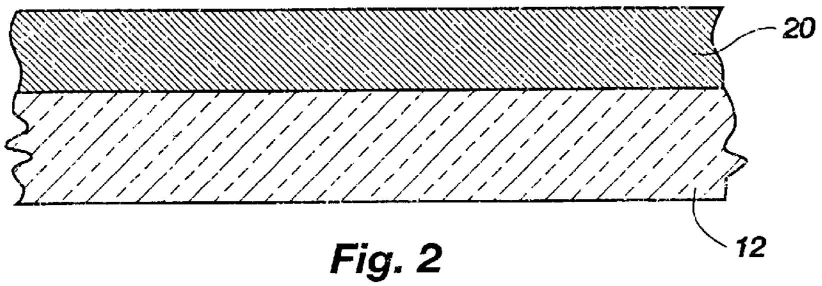
FIG. 2 is a schematic cross-sectional representation of the field emission array of FIG. 1, illustrating the blanket disposition of a layer of conductive material over a surface of a substrate.

With reference to FIG. 2, materials that may be employed as substrate 12 in the present invention include, without limitation, silicon, gallium arsenide, other semiconductive materials, silicon wafers, wafers of other semiconductive materials, silicon on glass ("SOG"), silicon on insulator ("SOI"), silicon on sapphire ("SOS"), and bare glass.

With continued reference to FIG. 2, a layer 20 of conductive material is disposed over substrate 12. Conductive materials, such as doped silicon, polysilicon, doped polysilicon, chromium, aluminum, molybdenum, copper, or other metals, may be employed as layer 20. The conductive material of layer 20 may be disposed over substrate 12 by known processes, such as by physical vapor deposition ("PVD") (e.g., sputtering) or by chemical vapor deposition ("CVD") (e.g., low pressure CVD ("LPCVD"), atmospheric pressure CVD ("APCVD"), or plasma-enhanced CVD ("PECVD")) processes. Layer 20 may be blanket deposited over substrate 12 or selectively deposited thereover.

Figure 3:
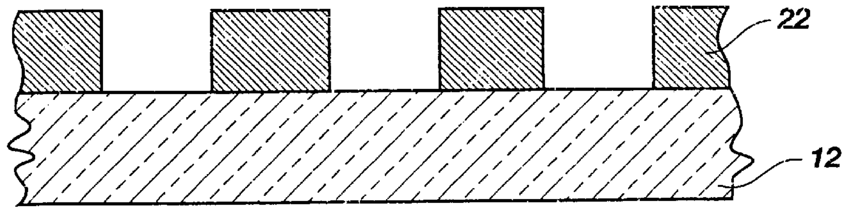
FIG. 3 is a schematic cross-sectional representation of the field emission array of FIG. 2, illustrating patterning of the layer of conductive material to define substantially mutually parallel conductive lines over the substrate.
Figure 3A:
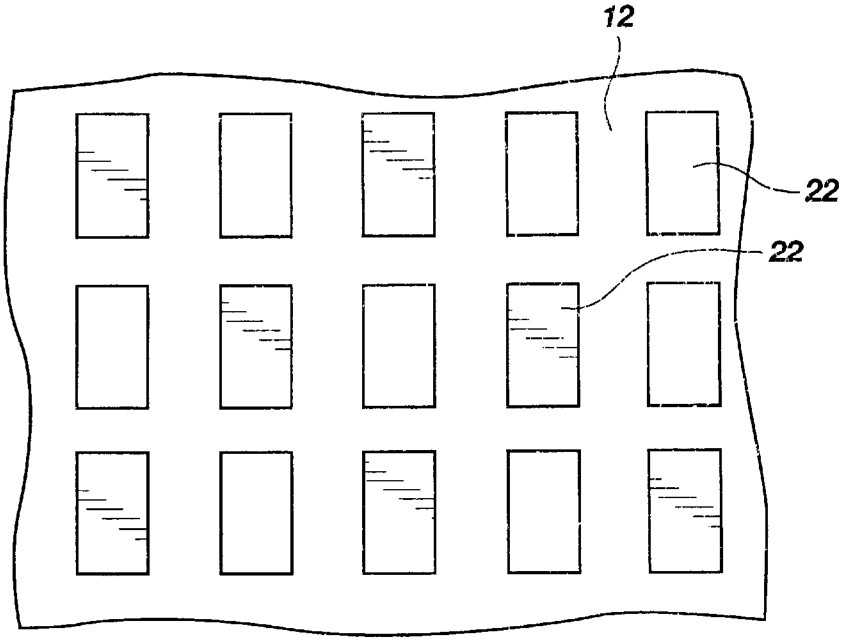
FIG. 3A is a schematic top view of the field emission array of FIG. 3.

With reference to FIGS. 3 and 3A, if layer 20 is blanket deposited over substrate 12, layer 20 may by patterned by known processes, such as by masking and etching techniques, to define substantially mutually parallel conductive lines 22 therefrom. If layer 20 is selectively deposited, the substantially mutually parallel conductive lines 22 may be fabricated during deposition of the conductive material of layer 20.

Figure 4:
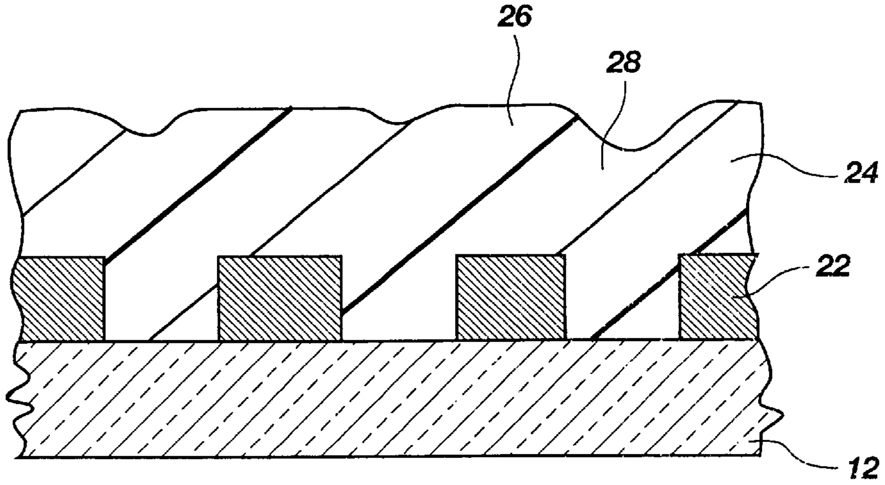
FIG. 4 is a schematic cross-sectional representation of the field emission array of FIG. 3, illustrating the disposition of an emitter tip-resistor layer over exposed portions of the substrate and over the substantially mutually parallel conductive lines.

Turning now to FIG. 4, a layer 24 of semiconductive material or conductive material, which is also referred to as a second layer or as an emitter tip-resistor layer, is disposed over conductive lines 22 and the regions of substrate 12 that are exposed between adjacent conductive lines 22. Since conductive lines 22 protrude somewhat from substrate 12 and layer 24 is disposed thereover in a substantially consistent thickness, layer 24 has a peak and valley appearance, with peaks 26 being located above conductive lines 22 and valleys 28, which are also referred to herein as depressions, being located between adjacent conductive lines 22.

Exemplary semiconductive materials that may be employed as layer 24 include, without limitation, single-crystalline silicon, amorphous silicon, polysilicon, and doped polysilicon. These materials may be deposited as known in the art, such as by chemical vapor deposition ("CVD") techniques. Of course, conductive materials having the desired properties and that are useful in fabricating emitter tips 18 and resistors 16 may also be employed in layer 24 and may be disposed over conductive lines 22 and the exposed regions of substrate 12 by known processes.

Figure 4A:
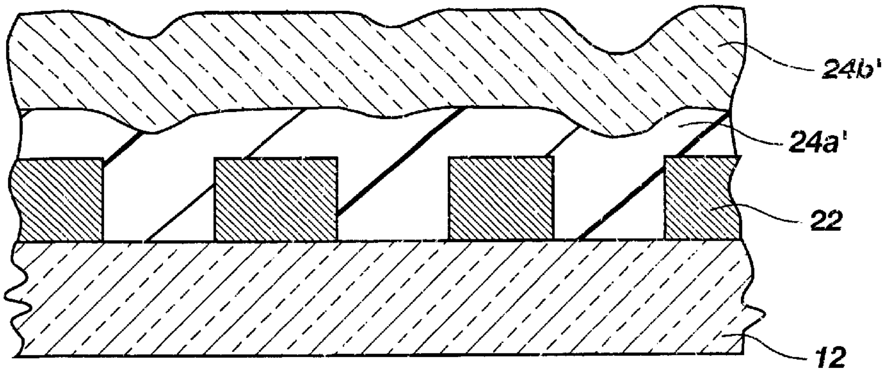
FIG. 4A is a schematic cross-sectional representation of a variation of the field emission array of FIG. 4, wherein the emitter tip-resistor layer comprises a layer of resistor material and a layer of emitter tip material disposed over the layer of resistor material.

Alternatively, it may be desirable to fabricate emitter tips 18 and resistors 16 from different semiconductive materials or conductive materials. For example, it may be desirable to fabricate resistors 16 from polysilicon, while a material such as single-crystalline silicon or amorphous silicon may be more desirable for fabricating emitter tips 18. Accordingly, with reference to FIG. 4A, a variation of the field emission array may include a resistor layer 24*a*' and an emitter tip layer 24*b*'. Resistor layer 24*a*' is disposed over conductive lines 22 and the regions of substrate 12 exposed between adjacent conductive lines 22. Emitter tip layer 24*b*' is disposed over resistor layer 24*a*'. As with layer 24 of FIG. 4, resistor layer 24*a*' and emitter tip layer 24*b*' may each have a peak and valley configuration.

Figure 5:
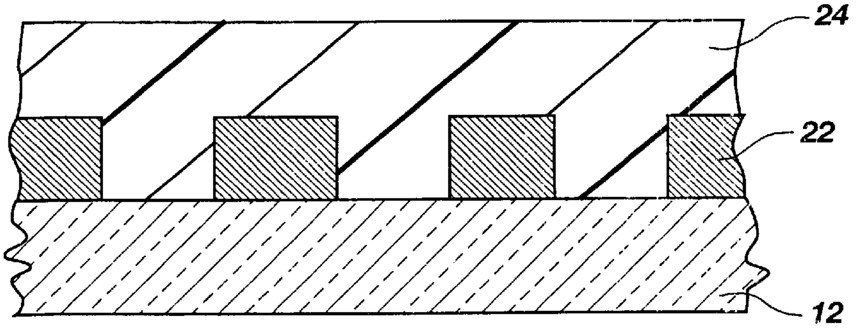
FIG. 5 is a schematic cross-sectional representation of the field emission array of FIG. 4, illustrating planarization of the emitter tip-resistor layer.

FIG. 5 illustrates planarization of the exposed surface of layer 24 to substantially remove peaks 26 (see FIGS. 4 and 4A), and possibly portions of valleys 28 (see FIGS. 4 and 4A), therefrom. Layer 24 may be planarized by known processes, such as by the chemical-mechanical planarization ("CMP") or chemical-mechanical polishing techniques taught in U.S. Pat. Nos. 4,193,226 and 4,811,522, the disclosures of both of which are hereby incorporated in their entireties by reference.

Preferably, the relative thicknesses of the regions of layer 24 above conductive lines 22 and other regions of layer 24 between conductive lines 22 facilitate the substantial removal of layer 24 from above portions of conductive lines 22 as emitter tips 18 and resistors 16 (see FIG. 1) of a desired height are defined between adjacent conductive lines 22 during a subsequent patterning of layer 24.

Figure 5A:
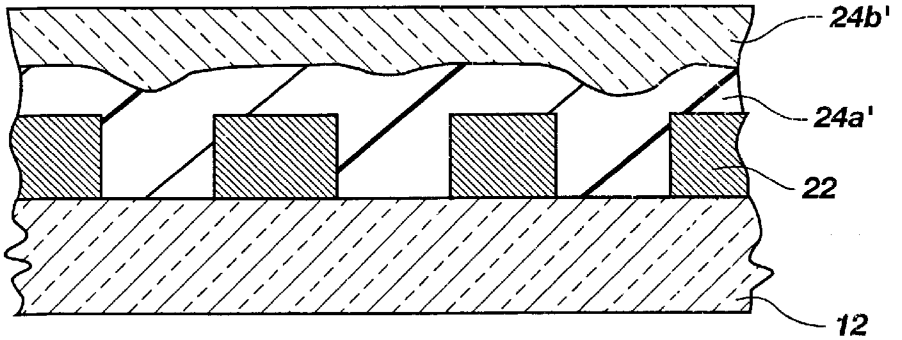
FIG. 5A is a schematic cross-sectional representation of the field emission array of FIG. 4A, illustrating planarization of the emitter tip layer.

With reference to FIG. 5A, if emitter tip layer 24*b*' (see FIG. 4A) is planarized, such as by known chemical-mechanical planarization techniques, the portions of layer 24*b*' that remain between adjacent conductive lines 22 preferably have a thickness that is sufficient to fabricate emitter tips 18 of a desired height therefrom.

Figure 6:
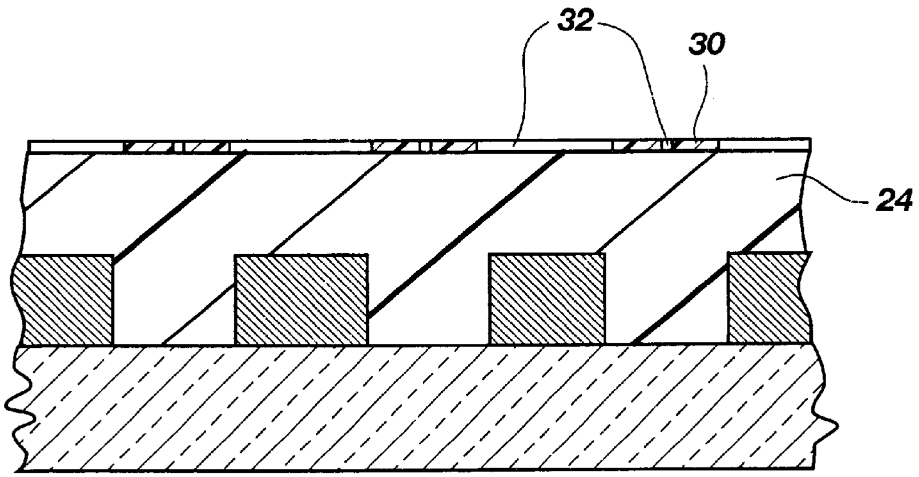
FIG. 6 is a schematic cross-sectional representation of the field emission array of either FIG. 4 or FIG. 5, illustrating the disposition of a mask over the emitter tip-resistor layer.

Referring now to FIG. 6, layer 24 may be patterned by disposing a mask 30 thereover and selectively removing portions of layer 24 through mask 30. Known techniques may be employed to dispose mask 30 over layer 24, such as disposing a layer of photoresist material over layer 24, and exposing and developing selected regions of the photoresist material to define apertures 32 therethrough in desired locations.

Figure 7:
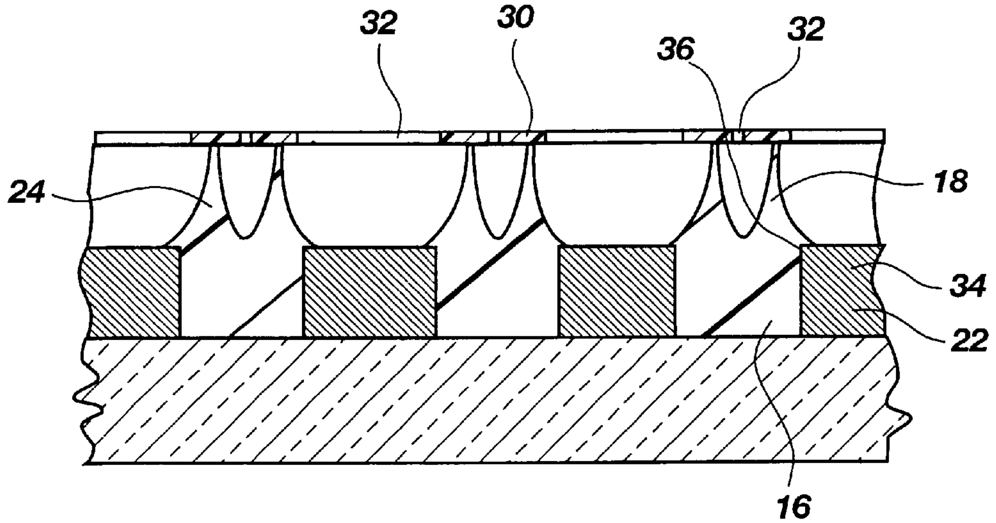
FIG. 7 is a schematic cross-sectional representation of the field emission array of FIG. 6, illustrating patterning of the emitter tip-resistor layer through apertures of the mask.

Turning now to FIG. 7, selected portions of layer 24 may be removed through apertures 32 of mask 30 by known techniques, such as etching, to define emitter tips 18 and resistors 16 and to substantially remove the material of layer 24 from above a substantially longitudinal center portion 34 of each conductive line 22. Either wet etching processes or dry etching processes may be employed. As emitter tips 18 may be conically shaped, the use of isotropic etching techniques is preferred. For example, if either single-crystalline or amorphous silicon is employed to fabricate emitter tips 18 (i.e., if these materials are employed as layer 24), wet etchants, such as mixtures of nitric acid ($HNO_3$) and hydrofluoric acid (HF), may be employed in known wet etch processes to remove material from selected regions of layer 24. As the exposure of conductive lines 22 through layer 24 and the definition of emitter tips 18 and resistors 16 from layer 24 may be effected through a single mask, each of these processes are said to occur substantially simultaneously for purposes of this disclosure. Preferably, as layer 24 is patterned, the material of layer 24 is not removed from (i.e., is maintained over) at least one peripheral edge portion 36 of each of conductive lines 22

If mask 30 or portions thereof remain following the definition of emitter tips 18 and resistors 16, mask 30 may be removed from layer 24 by known processes. Any etchants may also be removed from field emission array 10 by known processes, such as by washing field emission array 10.

Figure 8:
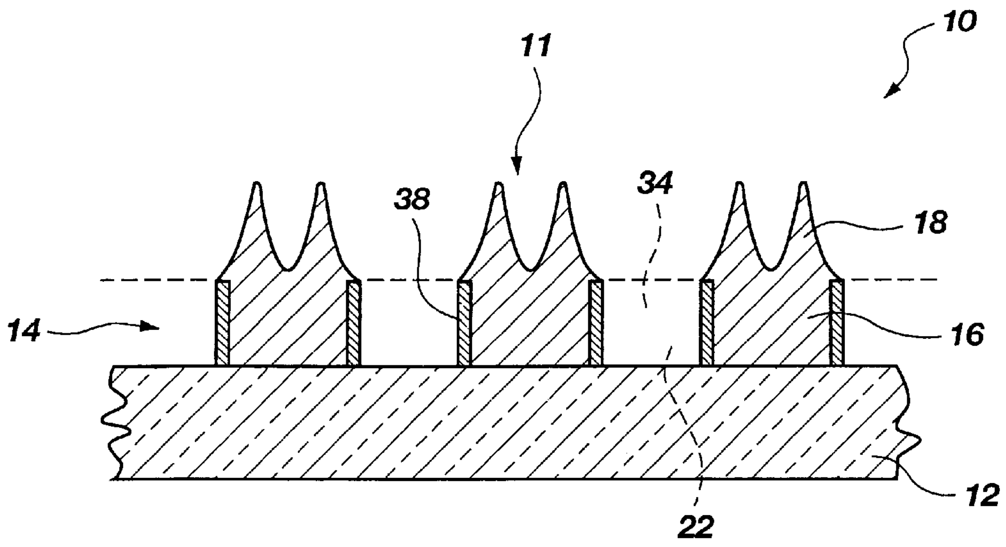
FIG. 8 is a schematic cross-sectional representation of the field emission array of FIG. 7, illustrating the definition of column lines and the electrical isolation of adjacent columns of pixels by removing a substantially longitudinal center portion of each of the conductive lines.

FIG. 8 depicts field emission array 10 following the removal of the conductive material of at least the substantially longitudinal center portion 34 of each conductive line 22. The conductive material of conductive lines 22 may be removed therefrom by known processes, such as by known etching techniques. The conductive material of substantially longitudinal center portion 34 is substantially removed such that the underlying regions of substrate 12 are exposed. Thus, as conductive lines 22 are patterned, column lines 14 are formed and adjacent columns of pixels 11 or emitter tips 18 are substantially electrically isolated from each other. If an etchant or etchants are employed to pattern conductive lines 22, any remaining etchants may be removed from field emission array 10 after the desired patterning has been performed. Etchants may be removed by known processes, such as by washing field emission array 10.

Each column line 14 preferably comprises a lateral edge portion 36 (FIG. 7) that remains from at least one of the conductive lines 22 that was previously between adjacent resistors 16. The remaining lateral edge portion 36 of a patterned conductive line 22, which is preferably disposed laterally adjacent its associated resistor 16, is also referred to herein as a lateral conductive layer 38. Preferably, each column line 14 includes two lateral conductive layers 38 with at least one resistor 16 disposed therebetween.

While either dry etching or wet etching techniques may be employed to pattern conductive lines 22, anisotropic etching of conductive lines 22 is preferred so as to facilitate the formation of lateral conductive layers 38 of substantially uniform thickness. For example, if conductive lines 22 comprise polysilicon, a dry etchant, such as a chlorine etchant, a fluorine etchant, or a combination thereof (e.g., $SF_6$ and $Cl_2$), may be employed in a dry etch process, such as glow-discharge sputtering, ion milling, reactive ion etching ("RIE"), reactive ion beam etching ("RIBE"), or high-density plasma etching.

The method of the present invention requires fewer fabrication steps than conventional field emission array fabrication processes. Accordingly, the method of the present invention may also facilitate a reduction in failure rates and production costs of field emission arrays.

Although the foregoing description contains many specifics and examples, these should not construed as limiting the scope of the present invention, but merely as providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein and which fall within the meaning of the claims are to be embraced within their scope.

What is claimed is:

1. A method for fabricating a field emission array, comprising:

forming at least one layer comprising conductive material over a surface of a substrate;

patterning said at least one layer to define substantially parallel rows of conductive structures;

forming at least another layer comprising conductive or semiconductive material over and between said conductive structures;

defining emitter tips and their corresponding resistors from portions of said at least another layer located adjacent a corresponding one of said conductive structures;

removing material of said conductive structures to form conductive traces adjacent lateral edges of said resistors and to electrically isolate resistors of one row from resistors of an adjacent row.

2. The method of claim 1, wherein said patterning comprises defining substantially parallel rows of conductive lines.

3. The method of claim 1, wherein said patterning is effected through a mask.

4. The method of claim 1, wherein said forming at least another layer comprises forming said at least another layer from at least semiconductive material.

5. The method of claim 1, wherein said forming at least another layer comprises:

forming a resistor material layer; and forming an emitter tip material layer.

6. The method of claim 1, further comprising substantially planarizing said at least another layer.

7. The method of claim 6, wherein said substantially planarizing is effected prior to said defining.

8. The method of claim 6, wherein said substantially planarizing comprises mechanically polishing a surface of said at least another layer.

9. The method of claim 1, wherein said defining comprises isotropically etching said at least another layer.

10. The method of claim 1, wherein said removing material comprises maintaining material of said conductive structures in regions located adjacent at least one peripheral edge of at least one adjacent conductive structure.

11. The method of claim 1, wherein said removing material comprises removing at least a substantially longitudinal central portion of at least one of said conductive structures.

12. The method of claim 1, wherein, following said defining, remaining material of said at least another layer overlies at least peripheral edge portions of said corresponding one of said conductive structures.

13. The method of claim 12, wherein said removing material comprises removing material of said corresponding one of said conductive structures exposed through remaining portions of said at least another layer.

14. A method for fabricating emitter tips and resistors of a field emission array, comprising:

forming at least one layer comprising conductive material over a surface of a substrate;

patterning said at least one layer to define substantially parallel rows of conductive structures;

forming at least another layer comprising conductive or semiconductive material over and between said conductive structures;

defining emitter tips and their corresponding resistors from portions of said at least another layer located adjacent a corresponding one of said conductive structures, remaining portions of said at least another layer covering longitudinal peripheral edge regions of said conductive structures, longitudinally central portions of said conductive structures being exposed through said remaining portions of said at least another layer;

removing said longitudinally central portions of said conductive structures to form conductive traces adjacent lateral edges of said resistors and to electrically isolate resistors of one row from resistors of an adjacent row.

15. The method of claim 14, wherein said patterning comprises defining substantially parallel rows of conductive lines.

16. The method of claim 14, wherein said patterning is effected through a mask.

17. The method of claim 14, wherein said forming at least another layer comprises forming said at least another layer from at least semiconductive material.

18. The method of claim 14, wherein said forming at least another layer comprises:

forming a resistor material layer; and forming an emitter tip material layer.

19. The method of claim 14, further comprising substantially planarizing said at least another layer.

20. The method of claim 19, wherein said substantially planarizing is effected prior to said defining.

21. The method of claim 19, wherein said substantially planarizing comprises mechanically polishing a surface of said at least another layer.

22. The method of claim 14, wherein said defining comprises isotropically etching said at least another layer.

* * * * *

UNITED STATES PATENT AND TRADEMARK OFFICE

CERTIFICATE OF CORRECTION

PATENT NO. : 6,326,222 B2

DATED : December 4, 2001

INVENTOR(S) : Ammar Derraa

It is certified that error appears in the above-identified patent and that said Letters Patent is hereby corrected as shown below:

Column 3,
Line 14, change “potions” to -- portions --

Column 6,
Line 34, insert a period after “22”

Signed and Sealed this

Fifteenth Day of April, 2003

JAMES E. ROGAN
*Director of the United States Patent and Trademark Office*